(12) United States Patent
Horii et al.

(10) Patent No.: US 7,767,491 B2
(45) Date of Patent: Aug. 3, 2010

(54) METHODS OF MANUFACTURING SEMICONDUCTOR DEVICE

(75) Inventors: Hideki Horii, Seoul (KR); Jeonghee Park, Hwasung-si (KR); Youngkuk Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/584,321

(22) Filed: Sep. 3, 2009

(65) Prior Publication Data

US 2010/0081263 A1 Apr. 1, 2010

(30) Foreign Application Priority Data

Sep. 30, 2008 (KR) ...................... 10-2008-0095936

(51) Int. Cl.
*H01L 21/06* (2006.01)
(52) U.S. Cl. ...................... 438/102; 438/243; 438/386; 257/E21.068
(58) Field of Classification Search .................. 438/102, 438/238, 239, 240, 243, 386, 387
See application file for complete search history.

(56) References Cited

U.S. PATENT DOCUMENTS

| | | | |
|---|---|---|---|
| 6,995,388 B2 | 2/2006 | Hwang et al. | |
| 7,498,064 B2 | 3/2009 | Horii | |
| 2004/0085833 A1 | 5/2004 | Hwang et al. | |
| 2006/0024429 A1 | 2/2006 | Horii | |
| 2009/0035514 A1* | 2/2009 | Kang et al. | 428/131 |
| 2009/0148980 A1* | 6/2009 | Yu | 438/102 |

FOREIGN PATENT DOCUMENTS

| | | |
|---|---|---|
| JP | 2004-158852 | 6/2004 |
| KR | 10-0481866 | 3/2005 |
| KR | 10-0612906 | 8/2006 |
| KR | 10-2007-0058054 A | 6/2007 |

* cited by examiner

*Primary Examiner*—Walter L Lindsay, Jr.
*Assistant Examiner*—Reema Patel
(74) *Attorney, Agent, or Firm*—Mills & Onello, LLP

(57) ABSTRACT

A method of manufacturing a semiconductor device includes forming a phase change material pattern on a top surface of an insulating layer including an opening and in the opening, and forming a compressive layer compressing the phase change material pattern on the phase change material pattern.

13 Claims, 6 Drawing Sheets

METHODS OF MANUFACTURING SEMICONDUCTOR DEVICE

CROSS-REFERENCE TO RELATED APPLICATIONS

This U.S. non-provisional patent application claims priority under 35 U.S.C. §119 of Korean Patent Application No. 10-2008-0095936, filed in the Korean Intellectual Property Office on Sep. 30, 2008, the entire contents of which are herein incorporated by reference.

BACKGROUND

The exemplary embodiments described herein relate to methods of manufacturing a semiconductor device having superior reliability.

As the electronics industry has developed, mobile communication devices and computers having improved performance are required. To meet these requirements, a semiconductor device having a high operational speed (for example, during read/write operations), a nonvolatile characteristic and a low operational voltage is required.

A unit cell of a widely used DRAM includes one capacitor and one transistor controlling the capacitor. Thus, a DRAM needs relatively a large unit cell area compared with that of a NAND flash of a string structure. Also, a DRAM is a volatile memory device, losing its stored data when a power supply is interrupted. In contrast, a flash memory is a nonvolatile memory device, maintaining stored data when a power supply is interrupted. However, since an operation of a flash memory is based on a tunneling phenomenon, operational speed is slow.

Accordingly, a study of a phase change memory device as a next generation memory having a high operational speed and a nonvolatile characteristic has been increased in importance. A unit cell of the phase change memory device is an element storing data and may include a phase change material. The phase change material may have states having different resistances. For example, a phase change material of a crystalline state may have a resistance lower than a phase change material of an amorphous state. A crystalline state of a phase change material can be controlled through a condition of a melting process and a cooling process.

Development of a manufacturing process of a phase change memory device is required with reference to a material problem and a structural problem of a phase change memory device.

SUMMARY

Some exemplary embodiments provide a method of manufacturing a semiconductor device. The method may include forming an insulating layer having an opening exposing a lower electrode; forming a phase change material pattern including a lower region filling a portion of the opening and an upper region protruding upward from the lower region to extend onto the insulating layer; forming a compressive layer on an exposed surface of the phase change material pattern; and contracting the compressive layer to compress the phase change material pattern.

In one embodiment, contracting the compressive layer comprises providing heat to the compressive layer. Providing the heat to the compressive layer may be performed at a temperature higher than a temperature at which the compressive layer is formed.

In one embodiment, forming the compressive layer is performed at a temperature lower than a temperature of an evaporation of a phase change material constituting the phase change material pattern.

In one embodiment, contracting the compressive layer is performed at a temperature lower than a melting point of a phase change material constituting the phase change material pattern.

In one embodiment, contracting the compressive layer comprises removing a void in the opening.

In one embodiment, the compressive layer comprises at least one of silicon oxide, silicon nitride, silicon oxy-nitride, aluminum oxide, aluminum nitride, titanium oxide, tantalum oxide, hafnium oxide and hafnium nitride.

In one embodiment, a width of the upper region is greater than a width of the lower region.

In one embodiment, the method further includes, before forming the compressive layer, forming an upper electrode on the phase change material pattern.

In one embodiment, forming the phase change material pattern and forming the upper electrode on the phase change material pattern include: forming a phase change material layer on the insulating layer including the opening; forming a conductive layer on the phase change material layer; and patterning the conductive layer and the phase change material layer to expose the insulating layer, wherein the upper electrode is aligned with the same sidewall as the phase change material pattern.

In one embodiment, the compressive layer extends onto the insulating layer from surfaces of the upper electrode and the phase change material pattern.

In one embodiment, forming the insulating layer including the opening exposing the lower electrode includes: forming the lower electrode on a lower insulating layer; forming the insulating layer on the lower electrode and the lower insulating layer; and selectively etching the insulating layer to expose a top surface of the lower electrode.

In one embodiment, forming the insulating layer including the opening exposing the lower electrode includes: forming the lower electrode on a lower insulating layer; forming the insulating layer on the lower electrode and the lower insulating layer; and etching the insulating layer and the lower electrode to expose the lower electrode to a sidewall of the opening.

BRIEF DESCRIPTION OF THE FIGURES

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this description will be thorough and complete, and will fully convey the invention to those skilled in the art. In the drawings, the size and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

Referring to FIGS. 1 through 6, a method of manufacturing a semiconductor device according to a first embodiment of the present invention is described.

Figure 1:
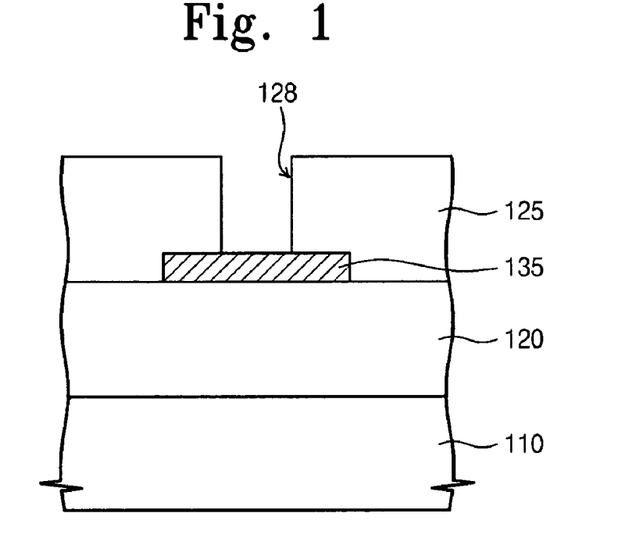
FIGS. 1 through 6 are schematic cross-sectional views illustrating a method of manufacturing a semiconductor device according to a first embodiment of the present invention.

Referring to FIG. 1, a first interlayer insulating layer 120 may be formed on a substrate 110. A lower electrode 135 may be formed on the first interlayer insulating layer 120. The lower electrode 135 may include at least one of titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten (W), tungsten nitride (WN), graphite, carbon nitride (CN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON) and tantalum oxynitride (TaON). The lower electrode 135 may be formed by a deposition process such as a physical vapor deposition (PVD) method, a chemical vapor deposition (CVD) method or an atomic layer deposition (ALD) method and a patterning process.

A second interlayer insulating layer 125 may be formed on the lower electrode 135. The second interlayer insulating layer 125 may include silicon oxide, silicon nitride, silicon oxy-nitride, aluminum oxide and/or titanium oxide. A patterning process is applied to the second interlayer insulating layer 125 to form a hole or opening 128 exposing a portion of a top surface of the lower electrode 135, in the second interlayer insulating layer 125. An aspect ratio of the hole 128 may be about 1 to about 10.

Figure 2:
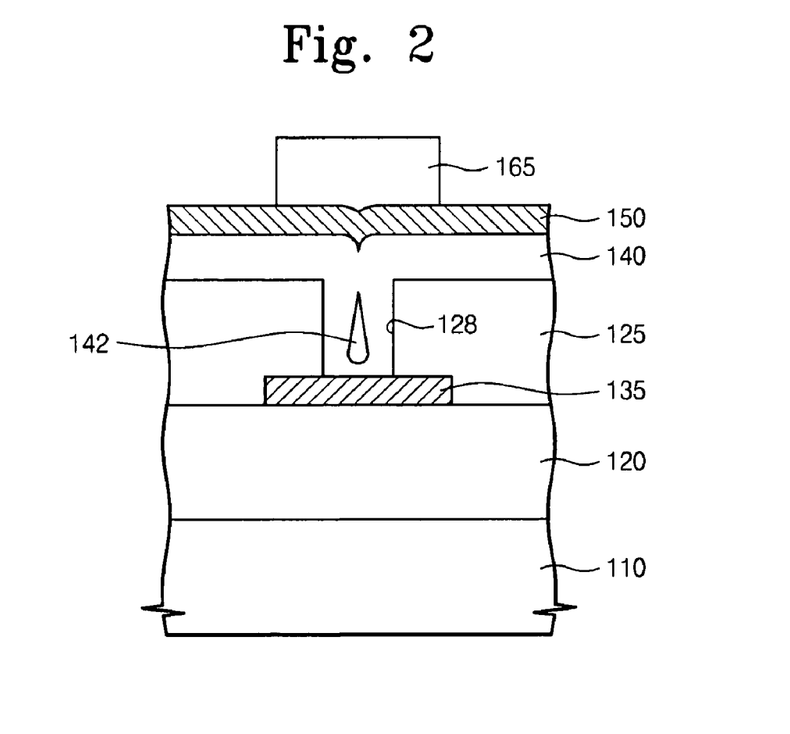

Referring to FIG. 2, a phase change material layer 140 may be formed on the second interlayer insulating layer 125. The phase change material layer 140 includes a chalcogenide compound. The phase change material layer 140 may include at least one of tellurium (Te), selenium (Se), germanium (Ge), antimony (Sb), bismuth (Bi), lead (Pb), tin (Sn), arsenic (As), sulphur (S), silicon (Si), phosphorus (P), oxygen (O), carbon (C), boron (B), gallium (Ga), indium (In), aluminum (Al), zinc (Zn), dysprosium (Dy), nickel (Ni) and platinum (Pt). The phase change material layer 140 may be formed using a sputtering method, a chemical vapor deposition (CVD)

method or an atomic layer deposition (ALD) method. The phase change material layer 140 may be formed inside of the hole 128 and on the second interlayer insulating layer 125. The hole 128 may not be fully filled with the phase change material layer 140, so that a void 142 may be formed in the hole 128.

A conductive layer 150 may be formed on the phase change material layer 140. The conductive layer 150 may include at least one of titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten (W), tungsten nitride (WN), graphite, carbon nitride (CN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON) and tantalum oxynitride (TaON). The conductive layer 150 may include a material that is the same as or different from the lower electrode 135. A mask pattern 165 may be formed on the conductive layer 150.

Figure 3:
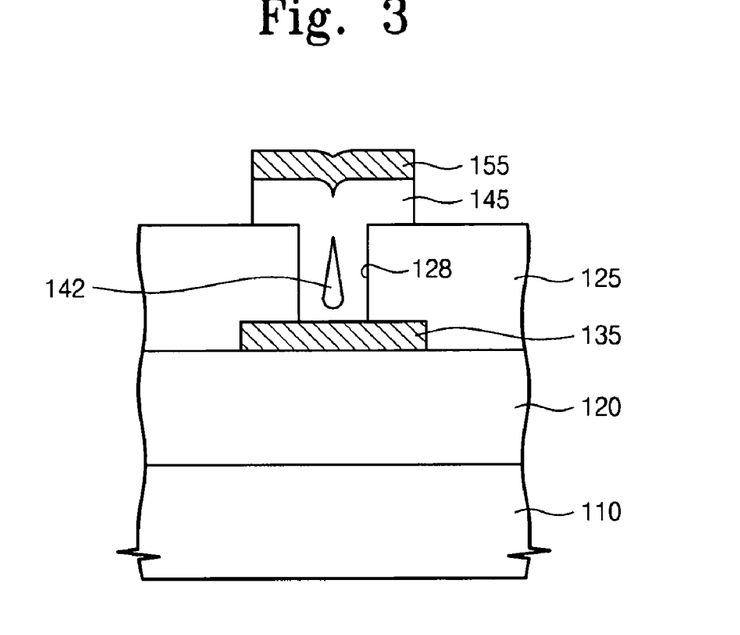

Referring to FIG. 3, the conductive layer 150 and the phase change material layer 140 are patterned using the mask pattern 165 to expose the second interlayer insulating layer 125. The mask pattern 165 may be removed during the patterning process or after patterning process. As a result, a phase change material pattern 145 and an upper electrode 155 that are sequentially stacked on the second interlayer insulating layer 125 may be formed. The phase change material pattern 145 may include a lower region disposed in the hole 128 and an upper region protruding upward from the second interlayer insulating layer 125 to extend onto the second interlayer insulating layer 125. The width of the upper region may be greater than a width of the lower region. A sidewall of the upper region and a sidewall of the upper electrode 155 may be disposed on the same side.

Figure 4:
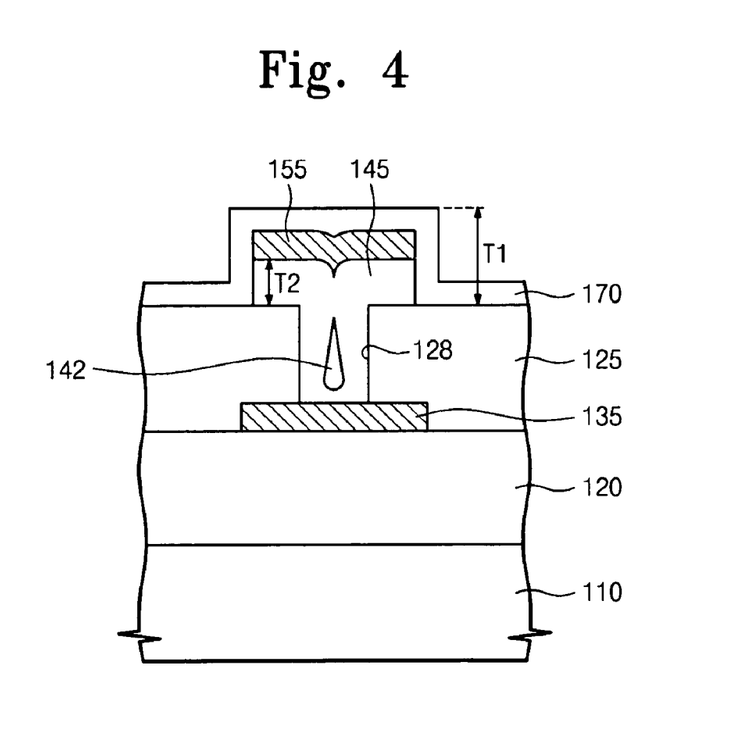

Referring to FIG. 4, a compressive layer 170 may be formed on a resultant structure of FIG. 3. The compressive layer 170 may be formed on exposed surfaces of the phase change material pattern 145 and the upper electrode 155. That is, the compressive layer 170 may extend onto the second interlayer insulating layer 125 from the exposed surfaces of the phase change material pattern 145 and the upper electrode 155. A height of the compressive layer 170 on the upper electrode 155 from the second interlayer insulating layer 125 may be represented as T1 and a height of the phase change material pattern 145 on and from the second interlayer insulating layer 125 may be represented as T2.

The compressive layer 170 may include silicon oxide, silicon nitride, silicon oxynitride, aluminum oxide, aluminum nitride, titanium oxide, tantalum oxide, hafnium oxide, hafnium nitride and/or undoped silicon glass (USG). The compressive layer 170 may be formed using an atomic layer deposition (ALD) method, a chemical vapor deposition (e.g., CVD, MOCVD, PECVD, HDP CVD) method or a physical vapor deposition (PVD) method. At this time, the compressive layer 170 may be formed under the condition of preventing material constituting the phase change material pattern 145 from being evaporated. That is, the compressive layer 170 may be formed at a temperature lower than an evaporation temperature of material constituting the phase change material pattern 145. Also, the compressive layer 170 may be formed at a pressure higher than an evaporation pressure of material constituting the phase change material pattern 145. Accordingly, a composition change of the phase change material pattern 145 by evaporation may be prevented while the compressive layer 170 is formed.

Figure 5:
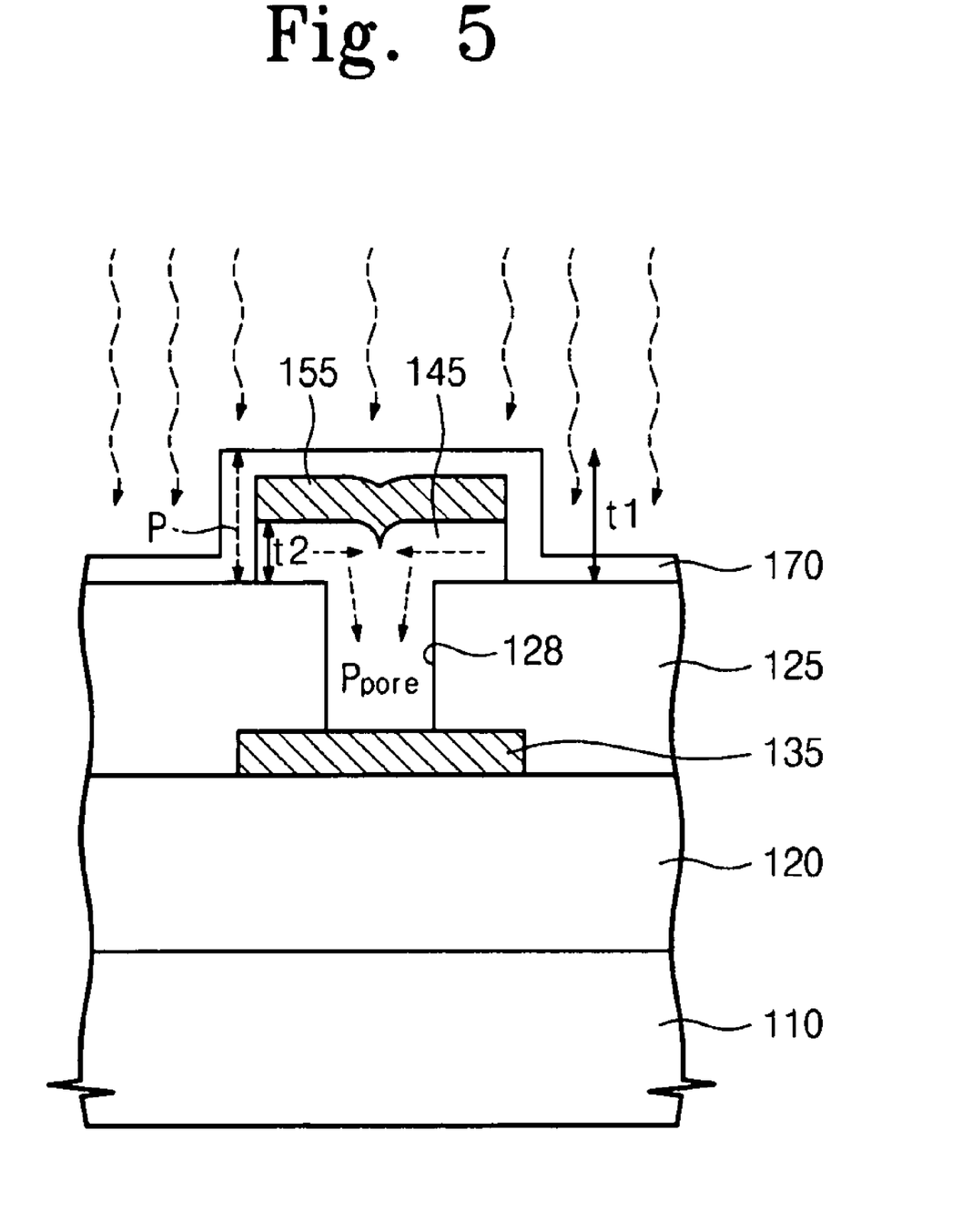

Referring to FIG. 5, the compressive layer 170 may be contracted. For example, a thermal process is applied to the compressive layer 170 so as to contract the compressive layer 170. The thermal process may be performed at a temperature higher than the temperature at which the compressive layer 170 is formed. Also, the thermal process may be performed at a temperature lower than a melting point of a phase change material constituting the phase change material pattern 145.

The thermal process may be performed under the condition of a vacuum, a low pressure or a normal pressure. Also, the thermal process may be a rapid thermal process (RTP) or a rapid thermal nitridation process (RTN). The thermal process may be performed in a deposition chamber or a furnace in which the compressive layer 170 is formed.

A height of the compressive layer 170 on the upper electrode 155 from the second interlayer insulating layer 125 may be decreased to t1 smaller than T1, and a height of the phase change material pattern 145 on and from the second interlayer insulating layer 125 may be decreased to t2 smaller than T2. That is, the compressive layer 170 is contracted, thereby compressing the phase change material pattern 145. When the compressive layer 170 is contracted, a compressive force may be applied in a side direction of the upper portion of the phase change material pattern 145 as well as an up and down direction of the upper portion of the phase change material pattern 145. Thus, the void 142 in the hole 128 may be filled with the phase change material as much as differences between T1 and t1 and between T2 and t2.

A compressive force is applied to the phase change material pattern 145, so that the phase change material pattern 145 may be compressed. A compressive force ($P_{pore}$) which is applied to the phase change material pattern 145 may be represented as follows.

$$P_{pore} = P(A_{cell}/A_{pore})$$

In the above formula, P is an external pressure by the compressive layer 170, $A_{cell}$ is a cross sectional area of a cell (i.e., a cross sectional area of the upper electrode 155 or a cross sectional area of an upper region of the phase change material pattern 145) and $A_{pore}$ is a cross sectional area of the hole 128.

Figure 6:
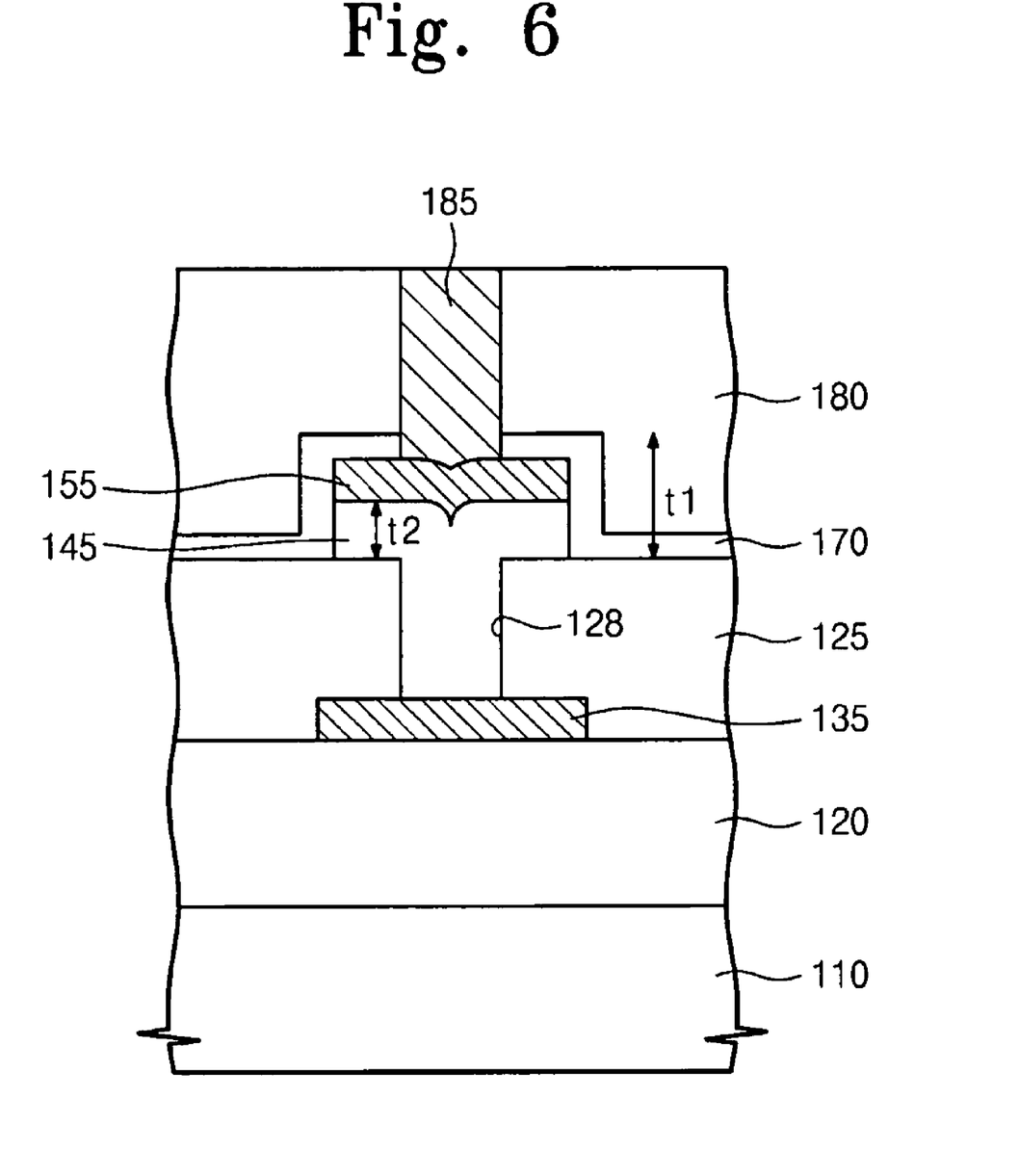

Referring to FIG. 6, a third interlayer insulating layer 180 may be formed on the resultant structure of FIG. 5. The third interlayer insulating layer 180 may be patterned, and then an interconnection plug 185 electrically connected to the upper electrode 155 may be formed. Subsequent interconnection processes may be performed.

A characteristic of a semiconductor device according to an embodiment of the present invention is described.

When a program voltage is applied to the lower electrode 135, a joule heating may be generated at a bottom surface of the change phase material pattern 145 which is in contact with the lower electrode 135. Accordingly, a phase change material constituting the phase change material pattern 145 may be melted. At this time, since a semiconductor device of FIG. 6 does not have voids in the hole 128, the phase change material pattern 145 may not lose the phase change material even if a phase change material of the phase change material pattern 145 is evaporated. Accordingly, the phase change material pattern 145 of FIG. 6 can maintain a composition ratio of a phase change material constituting the phase change material pattern 145.

On the contrary, if a void did exist in the hole of a semiconductor device, the phase change material pattern may lose phase change material by evaporation, so that a composition ratio of the phase change material of the phase change material pattern may be changed. A change of a composition ratio may bring about a change of characteristics of a semiconductor device, thereby degrading reliability of a semiconductor device.

Figure 7:
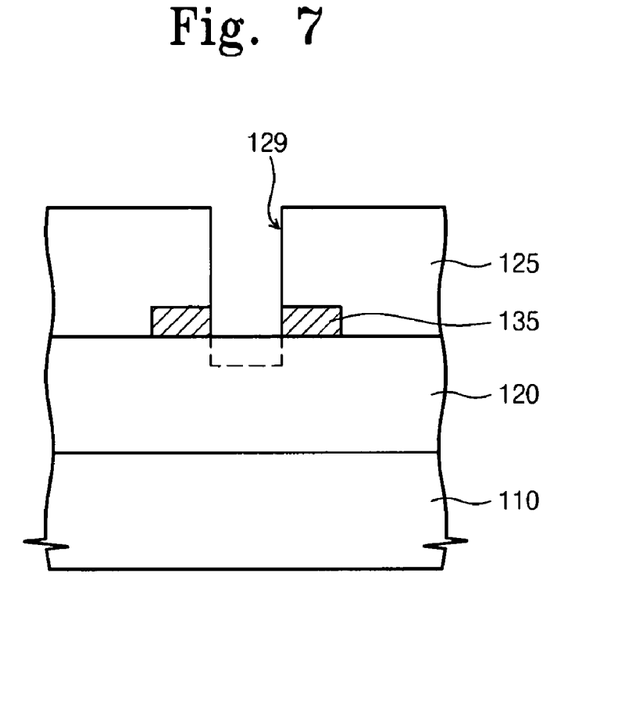
FIGS. 7 through 9 are schematic cross-sectional views illustrating a method of manufacturing a semiconductor device according to a second embodiment of the present invention.
Figure 8:
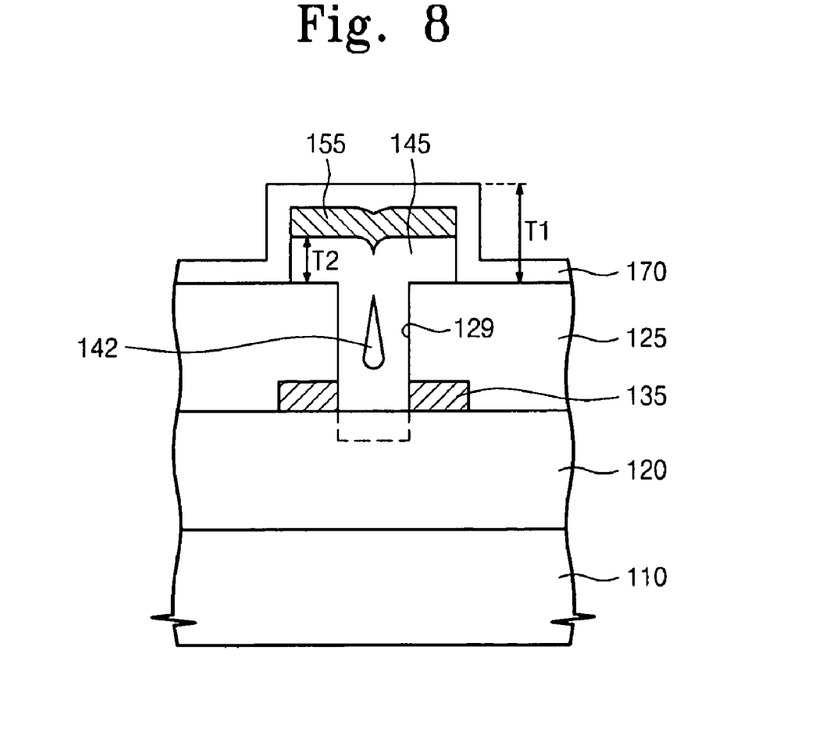
Figure 9:
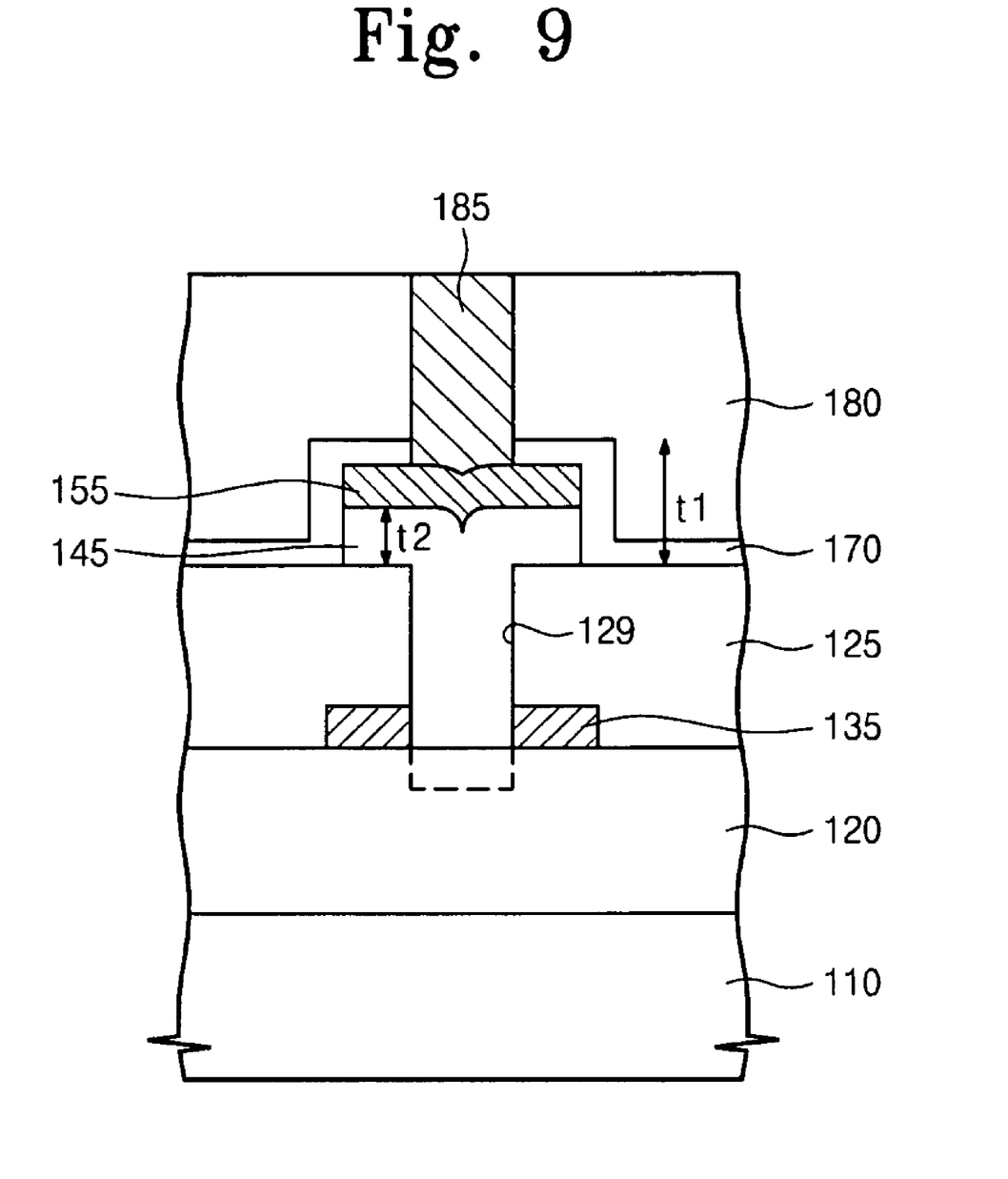

Referring to FIGS. 7 through 9, a method of manufacturing a semiconductor device according to a second embodiment of the present invention is described. The description of common features already described above will not be repeated.

Referring to FIG. 7, a first interlayer insulating layer 120 may be formed on a substrate 110. A lower electrode 135 may be formed on the first interlayer insulating layer 120. The lower electrode 135 may include the same material as the lower electrode of the first embodiment. The lower electrode 135 may be formed by a deposition process such as a physical vapor deposition (PVD) method, a chemical vapor deposition (CVD) method or an atomic layer deposition (ALD) method and a patterning process.

A second interlayer insulating layer 125 may be formed on the lower electrode 135. The second interlayer insulating layer 125 may include silicon oxide, silicon nitride, silicon oxynitride, aluminum oxide and/or titanium oxide. A patterning process is applied to the second interlayer insulating layer 125 to form a hole 129 in the second interlayer insulating layer 125. At this time, the lower electrode 135 may be exposed to a sidewall of the hole 129. The second interlayer insulating layer 125 and the lower electrode 135 may be etched to expose the first interlayer insulating layer 120. Alternatively, the first interlayer insulating layer 120 that is exposed by etching the second interlayer insulating layer 125 and the lower electrode 135 may be recessed. Thus, the hole 129 may penetrate through the lower electrode 135. An aspect ratio of the hole 129 may be about 1 to about 10.

Referring to FIG. 8, using the same method as the first embodiment, a phase change material pattern 145 and an upper electrode 155 that are sequentially stacked on the second interlayer insulating layer 125 may be formed. The phase change material pattern 145 may include a lower region disposed in the hole 128 and an upper region protruding upwardly from the second interlayer insulating layer 125 to extend onto the second interlayer insulating layer. In this case, it is preferable that the hole 129 be fully filled with the phase change material pattern 145. But the hole 129 may not be fully filled with the phase change material pattern 145, so that a void 142 may be formed in the hole 129. A width of the upper region may be greater than a width of the lower region. A sidewall of the upper region and a sidewall of the upper electrode 155 may be disposed on the same side.

A compressive layer 170 may be formed on exposed surfaces of the phase change material pattern 145 and the upper electrode 155. The compressive layer 170 may extend onto the second interlayer insulating layer 125 from the exposed surfaces of the phase change material pattern 145 and the upper electrode 155. A height of the compressive layer 170 on the upper electrode 155 from the second interlayer insulating layer 125 may be represented as T1 and a height of the phase change material pattern 145 on and from the second interlayer insulating layer 125 may be represented as T2. The compressive layer 170 may be formed under the same condition as that of the first embodiment.

Referring to FIG. 9, the compressive layer 170 may be contracted. For example, a thermal process is applied to the compressive layer 170 so as to contract the compressive layer 170. The thermal process may be the same process as the first embodiment.

A height of the compressive layer 170 on the upper electrode 155 from the second interlayer insulating layer 125 may be decreased to t1 smaller than T1 and a height of the phase change material pattern 145 on and from the second interlayer insulating layer 125 may be decreased to t2 smaller than T2. That is, the compressive layer 170 is contracted, thereby compressing the phase change material pattern 145. When the compressive layer 170 is contracted, a compressive force may be applied in a side direction of the phase change material pattern 145 as well as an up and down direction of the phase change material pattern 145. Thus, the void 142 in the hole 129 may be filled with the phase change material as much as differences between T1 and t1 and between T2 and t2.

A compressive force is applied to the phase change material pattern 145, so that the phase change material pattern 145 may be compressed. A compressive force ($P_{pore}$) applied to the phase change material pattern 145 may be represented as follows.

$$P_{pore}=P(A_{cell}/A_{pore})$$

In the above formula, P is an external pressure by the compressive layer 170, $A_{cell}$ is a cross-sectional area of a cell (i.e., a cross-sectional area of the upper electrode 155 or a cross-sectional area of an upper region of the phase change material pattern 145) and $A_{pore}$ is a cross-sectional area of the hole 129.

A third interlayer insulating layer 180 may be formed on the compressive layer 170. The third interlayer insulating layer 180 may be patterned, and then an interconnection plug 185 electrically connected to the upper electrode 155 may be formed. And then subsequent interconnection processes may be performed.

The foregoing is illustrative of the present invention and is not to be construed as limiting thereof. Although some embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a semiconductor device, comprising:
    forming an insulating layer having an opening exposing a lower electrode;
    forming a phase change material pattern including a lower region filling a portion of the opening and an upper region protruding upward from the lower region to extend onto the insulating layer;
    forming a compressive layer on an exposed surface of the phase change material pattern; and
    contracting the compressive layer to compress the phase change material pattern.

2. The method of claim 1, wherein contracting the compressive layer comprises providing heat to the compressive layer.

3. The method of claim 2, wherein providing the heat to the compressive layer is performed at a temperature higher than a temperature at which the compressive layer is formed.

4. The method of claim 2, wherein forming the compressive layer is performed at a temperature lower than a temperature of an evaporation of a phase change material constituting the phase change material pattern.

5. The method of claim 2, wherein contracting the compressive layer is performed at a temperature lower than a melting point of a phase change material constituting the phase change material pattern.

6. The method of claim 1, wherein contracting the compressive layer comprises removing a void in the opening.

7. The method of claim 1, wherein the compressive layer comprises at least one of silicon oxide, silicon nitride, silicon oxy-nitride, aluminum oxide, aluminum nitride, titanium oxide, tantalum oxide, hafnium oxide and hafnium nitride.

8. The method of claim 1, wherein a width of the upper region is greater than a width of the lower region.

9. The method of claim 1, further comprising, before forming the compressive layer, forming an upper electrode on the phase change material pattern.

10. The method of claim 9, wherein forming the phase change material pattern and forming the upper electrode on the phase change material pattern comprise:
    forming a phase change material layer on the insulating layer including the opening;
    forming a conductive layer on the phase change material layer; and
    patterning the conductive layer and the phase change material layer to expose the insulating layer, wherein the upper electrode is aligned with the same sidewall as the phase change material pattern.

11. The method of claim 9, wherein the compressive layer extends onto the insulating layer from surfaces of the upper electrode and the phase change material pattern.

12. The method of claim 1, wherein forming the insulating layer including the opening exposing the lower electrode comprises:
    forming the lower electrode on a lower insulating layer;
    forming the insulating layer on the lower electrode and the lower insulating layer; and
    selectively etching the insulating layer to expose a top surface of the lower electrode.

13. The method of claim 1, wherein forming the insulating layer including the opening exposing the lower electrode comprises:
    forming the lower electrode on a lower insulating layer;
    forming the insulating layer on the lower electrode and the lower insulating layer; and
    etching the insulating layer and the lower electrode to expose the lower electrode to a sidewall of the opening.

* * * * *